United States Patent
Sakui et al.

(10) Patent No.: US 12,396,154 B2
(45) Date of Patent: Aug. 19, 2025

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Masakazu Kakumu, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 166 days.

(21) Appl. No.: 18/461,914

(22) Filed: Sep. 6, 2023

(65) Prior Publication Data
US 2024/0081039 A1    Mar. 7, 2024

(30) Foreign Application Priority Data
Sep. 7, 2022    (WO) .................. PCT/JP2022/033565

(51) Int. Cl.
*G11C 11/404*    (2006.01)
*G11C 11/408*    (2006.01)
(Continued)

(52) U.S. Cl.
CPC ............ *H10B 12/20* (2023.02); *G11C 11/404* (2013.01); *G11C 11/4087* (2013.01); *G11C 11/4091* (2013.01); *G11C 11/4096* (2013.01)

(58) Field of Classification Search
CPC ...... H10B 12/20; H10B 43/27; G11C 11/404; G11C 11/4087; G11C 11/4091;
(Continued)

(56) References Cited

U.S. PATENT DOCUMENTS

| | | |
|---|---|---|
| 2003/0111681 A1 | 6/2003 | Kawanaka |
| 2008/0137394 A1 | 6/2008 | Shimano et al. |

(Continued)

FOREIGN PATENT DOCUMENTS

| | | |
|---|---|---|
| JP | H02188966 A | 7/1990 |
| JP | H03171768 A | 7/1991 |

(Continued)

OTHER PUBLICATIONS

International Search Report and Written Opinion (Japanese and English Translation) in PCT/JP2022/033565, dated Oct. 24, 2022 its pages.

(Continued)

*Primary Examiner* — Huan Hoang
(74) *Attorney, Agent, or Firm* — Crowell & Moring LLP (57) ABSTRACT

A memory device includes pages in a column direction on a substrate and memory cells in each page in a row direction in plan view. Each memory cell includes a semiconductor base, first and second impurity regions, connected to a source line and a bit line, respectively, at both ends of the semiconductor base, and first and second gate conductor layers, one of which is connected to a word line and the other of which is connected to a plate line. A continuous operation of a page erase operation and a page write operation is performed by controlling voltages applied to the source line, the bit line, the word line, and the plate line without performing a reset operation for returning the voltage applied to the plate line to a ground voltage.

15 Claims, 8 Drawing Sheets

(51) Int. Cl.
  G11C 11/4091 (2006.01)
  G11C 11/4096 (2006.01)
  H10B 12/00 (2023.01)
(58) Field of Classification Search
  CPC ........ G11C 11/4096; G11C 2211/4016; G11C 11/401; G11C 16/04
  USPC ........................................... 365/184
  See application file for complete search history.

(56) References Cited

U.S. PATENT DOCUMENTS

2022/0384446 A1* 12/2022 Harada .................. H10B 12/33
2023/0380139 A1  11/2023 Sakui et al.

FOREIGN PATENT DOCUMENTS

JP          7057032 B1    4/2022
WO     WO 2022/172318 A1  8/2022

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel $4F^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using A One-Transistor Gain Cell on SOI," IEEE JSSC, vol. 37, No. 11, pp. 1510-1522 (2002).

Shino, T., et al., "Floating Body RAM Technology and its Scalability to 32mm Node and Beyond", IEEE IEDM 2006 (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Paper*, T230-T231, Jun. 2017 (2 pages).

Jiang, H., et al., "Experimental Investigation of Self-Heating Effect (SHE) in Multigle-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

Morishita, F., et al., "A Capacitorless Twin-Transistor Random Access Memory (TTRAM) on SOI" *IEICE Trans. Electron*, vol. E90-C, No. 4, Apr. 2007, pp. 765-771 (7 pages).

Sakui, K., et al., "Dynamic Flash Memory with Dual Gate Surrounding Gate Transistor (SGT) for Computation In Memory" *Proc. IEEE IMW*, pp. 127-128 (2021) (2 pages).

* cited by examiner

MEMORY DEVICE USING SEMICONDUCTOR ELEMENT

CROSS REFERENCES TO RELATED APPLICATIONS

This application claims priority to PCT/JP2022/033565, filed Sep. 7, 2022, the entire content of which is incorporated herein by reference.

BACKGROUND OF THE INVENTION

1. Field of the Invention

The present invention relates to a memory device using a semiconductor element.

2. Description of the Related Art

In recent years, there has been a demand for higher integration and higher performance of memory elements in the development of LSI (Large Scale Integration) technology.

Higher density and higher performance of memory elements are being pursued. An SGT (Surrounding Gate Transistor, see Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transactions on Electron Devices, Vol. 38, No. 3, pp. 573-578 (1991)) is used as a selection transistor for a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceedings of the European Solid-State Device Research Conference, (2011)) to which a capacitor is connected, a PCM (Phase Change Memory, see, for example, H. S. Philip Wong, S. Raoux, S. Kim, J. Liang, J. P. Reifenberg, B. Rajendran, M. Asheghi, and K. E. Goodson: "Phase Change Memory," Proceedings of IEEE, Vol. 98, No. 12, December, pp. 2201-2227 (2010)) to which a resistance change element is connected, an RRAM (Resistive Random Access Memory, for example, see K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)), an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transactions on Electron Devices, Vol. 62, No. 6, pp. 1769-1777_(2015)) in which resistance is changed by changing the direction of magnetic spin by a current, and the like.

There is also a DRAM memory cell that does not have a capacitor and is constituted by one MOS (metal-oxide-semiconductor) transistor (see Japanese Unexamined Patent Application Publication No. 3-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electrons," IEEE Electron Device Letters, Vol. 31, No. 5, pp. 405-407 (2010), J. Wan, C. Le Royer, A. Zaslavsky, and S. Critoloveanu: "A Compact Capacitor-Less High-Speed DRAM Using Field Effect-Controlled Charge Regeneration," IEEE Electron Device Letters, Vol. 33, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama: "Floating Body RAM Technology and its Scalability to 32 nm Node and Beyond," IEEE IEDM (2006), and E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003)). For example, among a group of positive holes and electrons generated by an impact ionization phenomenon in a channel by a current between a source and a drain of an N-channel MOS transistor, some or all of the group of positive holes are retained in the channel to write logical storage data "1". Then, the group of positive holes are discharged from the channel to write logical storage data "0". With this memory cell, memory cells in which "1" is written and memory cells in which "0" is written are present at random with respect to a common selected word line. When an ON voltage is applied to the selected word line, a floating body channel voltage of a selected memory cell connected to the selected word line greatly varies due to capacitive coupling between a gate electrode and the channel. With this memory cell, it is an object to improve a decrease in an operation margin due to a variation in the floating body channel voltage and to improve a decrease in data retention characteristics due to discharge of some of the group of positive holes, which are signal charges accumulated in the channel.

In addition, there are twin-transistor MOS transistor memory elements in which one memory cell is formed in an SOI layer by using two MOS transistors (for example, see US2008/0137394 A1, US2003/0111681 A1, and F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., Vol. E90-c., No. 4 pp. 765-771 (2007)). In these elements, an $N^+$ layer that divides floating body channels of the two MOS transistors and serves as a source or a drain is formed in contact with an insulating layer on the substrate side. This $N^+$ layer electrically isolates the floating body channels of the two MOS transistors. A group of positive holes, which are signal charges, are accumulated only in the floating body channel of one of the MOS transistors. The other MOS transistor serves as a switch for reading the group of positive holes, which are signal charges accumulated in the one MOS transistor. With this memory cell as well, since the group of positive holes, which are signal charges, are accumulated in the channel of the one MOS transistor, as in the above-described memory cell constituted by the one MOS transistor, it is an object to improve the decrease in the operation margin or to improve the decrease in the data retention characteristics due to the discharge of some of the group of positive holes, which are signal charges, accumulated in the channel.

Figure 3A:
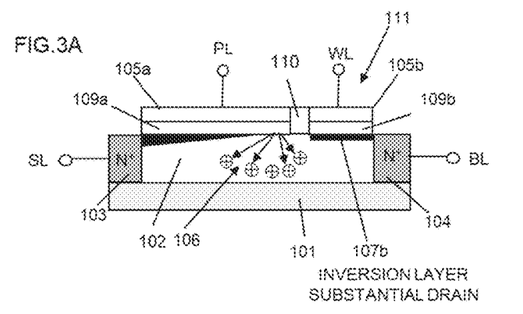
FIGS. 3A, 3B, 3C and 3D are diagrams for explaining a dynamic flash memory of the related art.

In addition, as illustrated in FIG. 3A, there is a dynamic flash memory cell 111 that does not have a capacitor and is constituted by a MOS transistor (see Japanese Patent No. 7057032 and K. Sakui and N. Harada: "Dynamic Flash Memory with Dual Gate Surrounding Gate Transistor (SGT)," Proc. IEEE IMW, pp. 72-75 (2021)). As illustrated in FIG. 3A, on an SiO₂ layer 101 of an SOI substrate, a floating body semiconductor base 102 is provided. An N⁺ layer 103 connected to a source line SL and an N⁺ layer 104 connected to a bit line BL are provided at both ends of the floating body semiconductor base 102. Furthermore, a first gate insulating layer 109a is connected to the N⁺ layer 103 and covers the floating body semiconductor base 102. A second gate insulating layer 109b is connected to the N⁺ layer 104, is connected to the first gate insulating layer 109a with a slit insulating film 110 interposed therebetween, and covers the floating body semiconductor base 102. In addition, a first gate conductor layer 105a covers the first gate insulating layer 109a and is connected to a plate line PL, and a second gate conductor layer 105b covers the second gate insulating layer 109b and is connected to a word line WL. The slit insulating film 110 is between the first gate conductor layer 105a and the second gate conductor layer 105b. Thus, the memory cell 111 of a dynamic flash memory (DFM) is formed. Note that the source line SL may be connected to the N⁺ layer 104, and the bit line BL may be connected to the N⁺ layer 103.

Figure 3B:
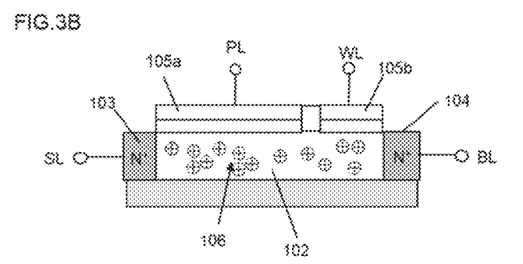

As illustrated in FIG. 3A, for example, a zero voltage is applied to the N⁺ layer 103 and a positive voltage is applied to the N⁺ layer 104 to operate a first N-channel MOS transistor region in a saturation region and to operate a second N-channel MOS transistor region in a linear region. The first N-channel MOS transistor region is constituted by the floating body semiconductor base 102 covered with the first gate conductor layer 105a, and the second N-channel MOS transistor region is constituted by the floating body semiconductor base 102 covered with the second gate conductor layer 105b. As a result, no pinch-off point is present in the second N-channel MOS transistor region, and an inversion layer 107b is formed on the entire surface. The inversion layer 107b formed under the second gate conductor layer 105b connected to the word line WL functions as a substantial drain of the first N-channel MOS transistor region. As a result, the electric field is maximized in the boundary region of the semiconductor base between the first N-channel MOS transistor region and the second N-channel MOS transistor region, and the impact ionization phenomenon occurs in this region. Then, as illustrated in FIG. 3B, a memory write operation is performed by discharging, from the floating body semiconductor base 102, a group of electrons among a group of electrons and positive holes generated by the impact ionization phenomenon, and retaining some or all of a group of positive holes 106 in the floating body semiconductor base 102. This state corresponds to the logical storage data "1".

Figure 3C:
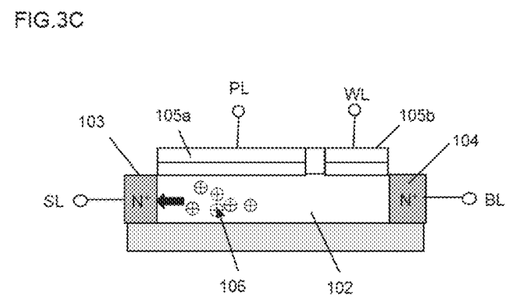
Figure 3D:
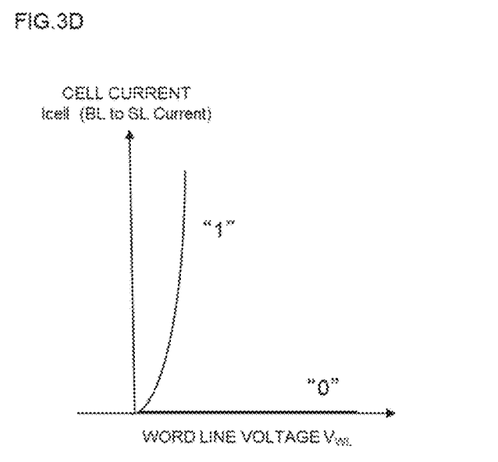

Then, as illustrated in FIG. 3C, for example, a positive voltage is applied to the plate line PL, a zero voltage is applied to the word line WL and the bit line BL, and a negative voltage is applied to the source line SL to discharge the group of positive holes 106 from the floating body semiconductor base 102, thereby performing an erase operation. This state corresponds to the logical storage data "0". By setting the voltage applied to the first gate conductor layer 105a connected to the plate line PL to be higher than a threshold voltage at the time of the logical storage data "1" and lower than a threshold voltage at the time of the logical storage data "0", as illustrated in FIG. 3D, a characteristic is obtained in which no current flows even when the voltage of the word line WL is increased at the time of reading the logical storage data "0". With this characteristic, the operation margin can be largely expanded as compared with the above-described memory cells. In the memory cell 111, since the channels of the first and second N-channel MOS transistor regions, in which gates are the first gate conductor layer 105a connected to the plate line PL and the second gate conductor layer 105b connected to the word line WL, are connected to each other by the floating body semiconductor base 102, the voltage variation of the floating body semiconductor base 102 when a selection pulse voltage is applied to the word line WL is largely suppressed. This significantly improves the above-described problem in the above-described memory cells, which is the decrease in the operation margin or the decrease in the data retention characteristics due to the discharge of some of the group of positive holes, which are signal charges accumulated in the channel. In the future, further improvement will be required for the characteristics of this memory element.

SUMMARY OF THE INVENTION

In a dynamic flash memory cell, a refresh operation for retaining logical data of the memory cell is required.

In order to achieve the above object, a memory device using a semiconductor element according to an aspect of the present invention is a memory device in which, in plan view, a plurality of pages are arranged in a column direction on a substrate, each of the plurality of pages including a plurality of memory cells arranged in a row direction, in which each of the memory cells included in each of the pages includes:

a semiconductor base standing vertically or extending horizontally on the substrate;

a first impurity region and a second impurity region at both ends of the semiconductor base;

a gate insulating layer in contact with a side surface of the semiconductor base between the first impurity region and the second impurity region;

a first gate conductor layer covering a part or an entirety of the gate insulating layer; and a second gate conductor layer adjacent to the first gate conductor layer and in contact with a side surface of the gate insulating layer, in each of the memory cells, the first impurity region is connected to a source line, the second impurity region is connected to a bit line, one of the first gate conductor layer and the second gate conductor layer is connected to a word line, and an other of the first gate conductor layer and the second gate conductor layer is connected to a plate line, in a page erase operation, a first voltage higher than a ground voltage is applied to the plate line of the page, a second voltage equal to or higher than the ground voltage is applied to the word line, a third voltage equal to the ground voltage is applied to the source line, and a fourth voltage higher than the ground voltage is applied to all the bit lines, in a page write operation, a fifth voltage higher than the ground voltage is applied to the plate line, a sixth voltage higher than the ground voltage is applied to the word line, a seventh voltage equal to the ground voltage is applied to the source line, an eighth voltage equal to the ground voltage is applied to the bit line of any memory cell among the memory cells to maintain an erase state, and a ninth voltage higher than the ground voltage is applied to the bit line of any memory cell among the memory cells to be in a write state, and the page erase operation and the page write operation are continuously performed without performing a reset operation for returning the voltage applied to the plate line to the ground voltage (first invention).

In the first invention above, the ground voltage is zero volts (second invention).

In the first invention above, in the page erase operation, some of the group of positive holes in the semiconductor base of the memory cells of the page are eliminated to reduce a number of positive holes, and in the page write operation, the number of positive holes in the semiconductor base of a selected memory cell among the memory cells of the page is increased by an impact ionization phenomenon (third invention).

In the first invention above, the word line and the plate line are arranged in parallel in plan view, and the bit line is arranged in a direction perpendicular to the word line and the plate line in plan view (fourth invention).

In the first invention above, a first gate capacitance between the semiconductor base and the other of the first gate conductor layer and the second gate conductor layer, to which the plate line is connected, is larger than a second gate capacitance between the semiconductor base and the one of the first gate conductor layer and the second gate conductor layer, to which the word line is connected (fifth invention).

In the first invention above, the source line is isolated for each of the memory cells arranged in the row direction and is arranged in parallel with the word line and the plate line in plan view (sixth invention).

In the first invention above, the source line is connected in common to all the memory cells of adjacent pages among the pages in plan view (seventh invention).

In the first invention above, the semiconductor base is a P-type semiconductor layer, and the first impurity region and the second impurity region are N-type semiconductor layers (eighth invention).

In the first invention above, data in the memory cells connected to at least two pages among the pages is selectively erased in the page erase operation (ninth invention).

In the first invention above, the word line and the plate line are connected to a row decoder circuit, a row address is to be input to the row decoder circuit, and any page among the pages is to be selected in accordance with the row address (tenth invention).

In the first invention above, the bit line is connected to a sense amplifier circuit with a switch circuit interposed therebetween, the sense amplifier circuit is connected to a column decoder circuit, a column address is to be input to the column decoder circuit, and the sense amplifier circuit is to be selectively connected to an input/output circuit in accordance with the column address (eleventh invention).

In the eleventh invention above, in the page write operation, inverse logical data of data in the page write operation is written in the sense amplifier circuit (twelfth invention).

In the first invention above, the first voltage and the fifth voltage are equal (thirteenth invention).

In the first invention above, one or both of the first gate conductor layer and the second gate conductor layer are divided into two or more isolated gate conductor layers in plan view or in a vertical direction, and the isolated gate conductor layers are to be operated synchronously or asynchronously (fourteenth invention).

In the fourteenth invention above, in plan view or in the vertical direction, the isolated gate conductor layers of one of the first gate conductor layer and the second gate conductor layer are arranged on both sides of an other of the first gate conductor layer and the second gate conductor layer (fifteenth invention).

DESCRIPTION OF THE PREFERRED EMBODIMENTS

A memory device using a semiconductor element (hereinafter, referred to as a dynamic flash memory) according to an embodiment of the present invention will be described below with reference to the drawings.

First Embodiment

The structure and operation mechanism of a dynamic flash memory cell according to a first embodiment of the present invention will be described with reference to FIG. 1 and FIGS. 2A to 2H. The structure of the dynamic flash memory cell will be described with reference to FIG. 1. Then, a page read operation mechanism capable of performing a refresh operation of logical data "1" and logical data "0" will be described with reference to FIGS. 2A to 2H.

Figure 1:
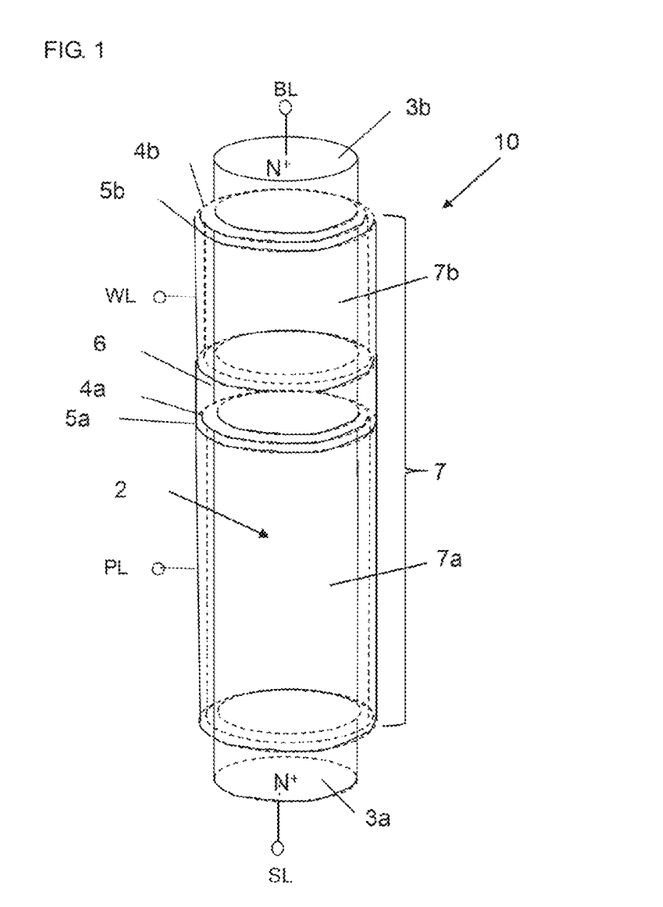
FIG. 1 is a structural diagram of a memory cell having an SGT according to a first embodiment.

FIG. 1 illustrates the structure of the dynamic flash memory cell according to the first embodiment of the present invention. A p-type or i-type (intrinsic type) silicon semiconductor pillar 2 (hereinafter, the silicon semiconductor pillar is referred to as a "Si pillar") (an example of "semiconductor base" in the claims) is formed on a substrate. At upper and lower positions in the Si pillar 2, $N^+$ layers 3a and 3b (examples of "first impurity region" and "second impurity region" in the claims), one of which serves as a source and the other of which serves as a drain, are formed. A portion of the Si pillar 2 between the $N^+$ layers 3a and 3b serving as the source and the drain corresponds to a semiconductor base 7 (an example of "semiconductor base" in the claims). A first gate insulating layer 4a (an example of "first gate insulating layer" in the claims) and a second gate insulating layer 4b (an example of "second gate insulating layer" in the claims) are formed so as to surround the semiconductor base 7. The first gate insulating layer 4a and the second gate insulating layer 4b are in contact with or close to the N+ layers 3a and 3b serving as the source and the drain, respectively. A first gate conductor layer 5a (an example of "first gate conductor layer" in the claims) and a second gate conductor layer 5b (an example of "second gate conductor layer" in the claims) are formed so as to surround the first gate insulating layer 4a and the second gate insulating layer 4b, respectively. The first gate conductor layer 5a and the second gate conductor layer 5b are isolated from each other by an insulating layer 6. The semiconductor base 7 between the N+ layers 3a and 3b includes a first semiconductor base 7a surrounded by the first gate insulating layer 4a and a second semiconductor base 7b surrounded by the second gate insulating layer 4b. As a result, a dynamic flash memory cell 10 including the N+ layers 3a and 3b serving as the source and drain, the semiconductor base 7, the first gate insulating layer 4a, the second gate insulating layer 4b, the first gate conductor layer 5a, and the second gate conductor layer 5b is formed. The N+ layer 3a serving as the source, the N+ layer 3b serving as the drain, the first gate conductor layer 5a, and the second gate conductor layer 5b are connected to a source line SL (an example of "source line" in the claims), a bit line BL (an example of "bit line" in the claims), a plate line PL (an example of "plate line" in the claims), and a word line WL (an example of "word line" in the claims), respectively. It is desirable to have a structure in which a first gate capacitance (an example of "first gate capacitance" in the claims) of the first gate conductor layer 5a to which the plate line PL is connected be larger than a second gate capacitance (an example of "second gate capacitance" in the claims) of the second gate conductor layer 5b to which the word line WL is connected. Note that the Si pillar 2 may be formed horizontally with respect to the substrate. In addition, a gate conductor layer connected to the plate line PL may be provided on the side of the N+ layer 3b connected to the bit line BL, and a gate conductor layer connected to the word line WL may be provided on the side of the N+ layer 3a connected to the source line SL.

FIGS. 2A to 2H illustrate a page read operation, a page erase operation (an example of "page erase operation" in the claims), and a page write operation (an example of "page write operation" in the claims) of the dynamic flash memory cell according to the first embodiment of the present invention. In these operations, the page erase operation and the page write operation are continuously performed.

Figure 2A:
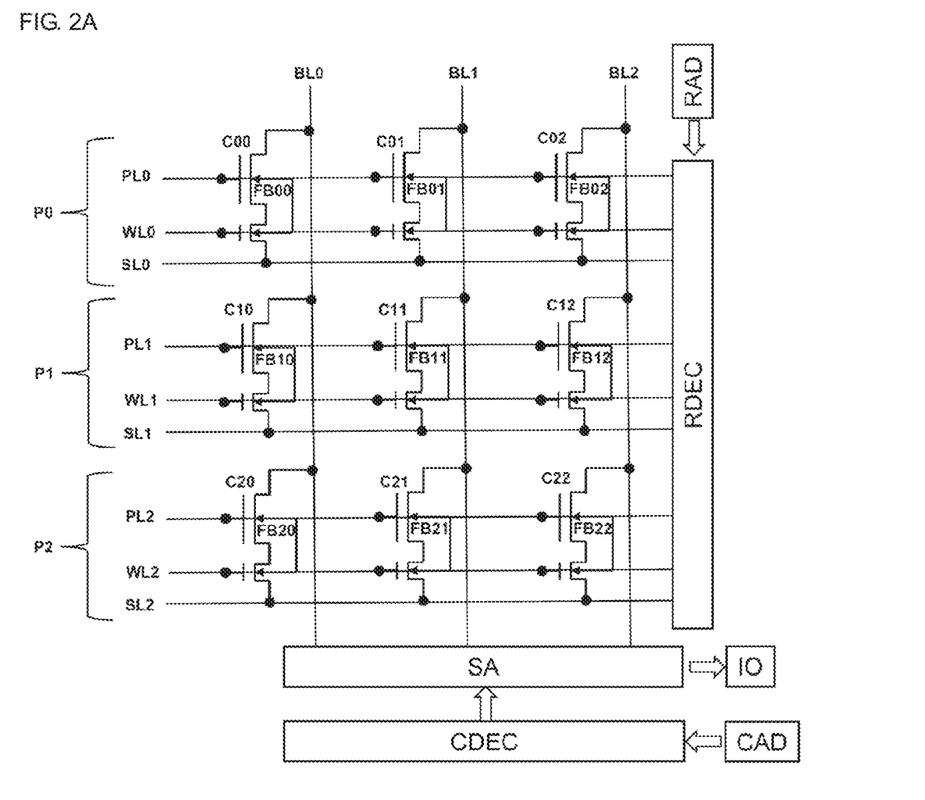
FIG. 2A is a diagram for explaining a continuous operation of a page erase operation and a page write operation of a memory device according to the first embodiment.

FIG. 2A is a memory block diagram including a main circuit for explaining the continuous operation of the page erase operation and the page write operation. Word lines WL0 to WL2 and plate lines PL0 to PL2 are connected to a row decoder circuit RDEC (an example of "row decoder circuit" in the claims), a row address RAD (an example of "row address" in the claims) is input to the row decoder circuit, and any of pages P0 to P2 is selected according to the row address RAD. In addition, bit lines BL0 to BL2 are connected to a sense amplifier circuit SA (an example of "sense amplifier circuit" in the claims), the sense amplifier circuit SA is connected to a column decoder circuit CDEC (an example of "column decoder circuit" in the claims), a column address CAD (an example of "column address" in the claims) is input to the column decoder circuit CDEC, and the sense amplifier circuit SA is selectively connected to an input/output circuit IO (an example of "input/output circuit" in the claims) in accordance with the column address CAD.

For memory cells constituting the memory block in FIG. 2A, the plate lines PL0 to PL2 are provided on the side of the bit lines BL0 to BL2, and the word lines WL0 to WL2 are provided on the side of source lines SL0 to SL2. That is, the first gate conductor layer 5a is connected to the word line, and the second gate conductor layer 5b is connected to the plate line. A total of nine memory cells C00 to C22 in three rows×three columns are illustrated herein in plan view, but the number of memory cells in an actual memory block is larger than this. When the memory cells are arranged in rows and columns, one direction of the arrangement is referred to as a "row direction" (or "row shape"), and a direction perpendicular to the row direction is referred to as a "column direction" (or "column shape"). The source lines SL0 to SL2, the plate lines PL0 to PL2, and the word lines WL0 to WL2 are arranged in parallel, and the bit lines BL0 to BL2 are arranged in a direction perpendicular to these lines. For example, in this block, it is assumed that the memory cells C10 to C12 to which the plate line PL1, the word line WL1, and the source line SL1 of a given page P1 are connected are selected, and the page erase operation and the page write operation are performed.

Figure 2B:
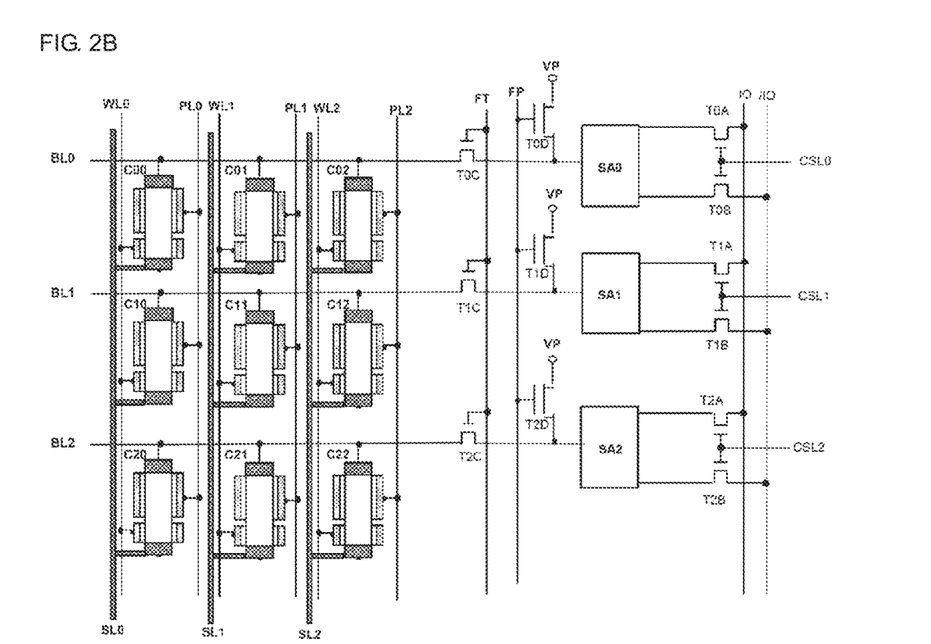
FIG. 2B is a diagram for explaining the continuous operation of the page erase operation and the page write operation of the memory device according to the first embodiment.

FIG. 2B illustrates an equivalent circuit of the memory cell block in FIG. 2A in more detail. Each of transistors T0C to T2C having gates that receive a transfer signal FT constitutes a switch circuit (an example of "switch circuit" in the claims). In addition, transistors T0D to T2D having gates connected to a bit line supply signal FP have drains connected to a bit line supply voltage VP and sources connected to the bit lines BL0 to BL2, respectively. The bit lines BL0 to BL2 are connected to sense amplifier circuits SA0 to SA2 via the switch circuits. The sense amplifier circuits SA0 to SA2 are connected to a pair of complementary input/output lines IO and/IO via transistors T0A to T2B having gates connected to column selection lines CSL0 to CSL2.

Figure 2C:
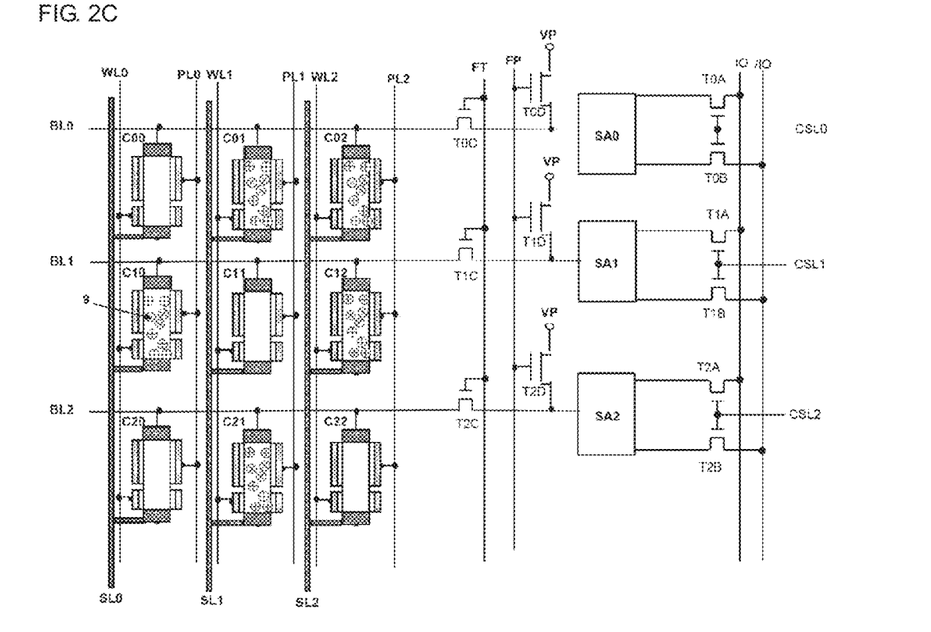
FIG. 2C is a diagram for explaining the continuous operation of the page erase operation and the page write operation of the memory device according to the first embodiment.

FIG. 2C illustrates a state in which "1" is written at random in the memory cells C01, C02, C10, C12, and C21 among the memory cells C00 to C22 at a given timing. The state in which the logical data "1" is stored corresponds to a write state (an example of "write state" in the claims) in which a group of positive holes 9 are accumulated in the semiconductor base 7. On the other hand, in the semiconductor base 7 of the memory cells C00, C11, C20, and C22 in which "1" writing is not performed, the group of positive holes 9 are not accumulated, and an erase state is set in which the logical data "0" is stored (an example of "erase state" in the claims). Then, the continuous operation of the page erase operation and the page write operation is performed on the group of memory cells C01, C11, and C21 selected by the word line WL1.

Figure 2D:
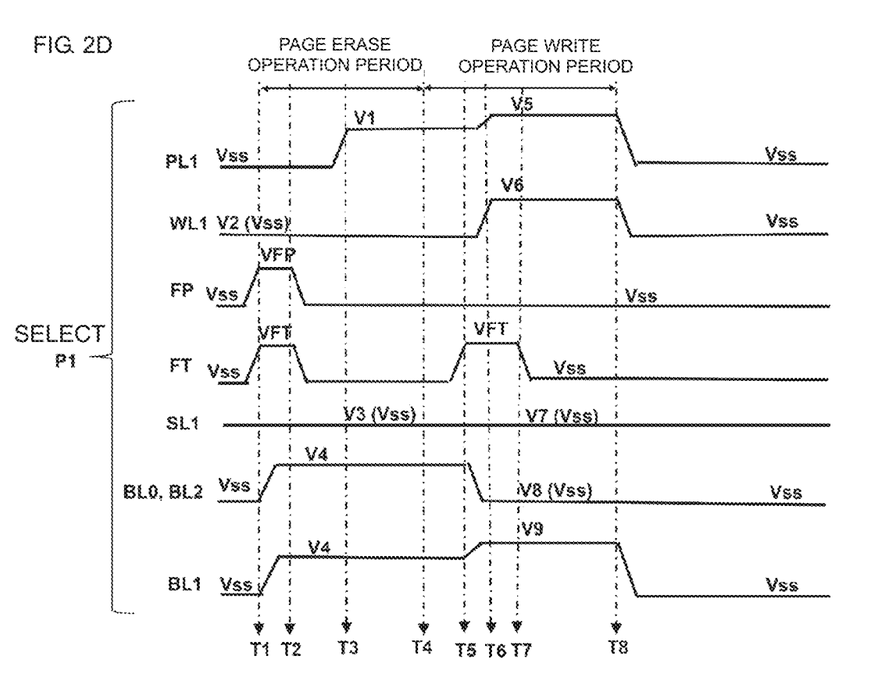
FIG. 2D is a diagram for explaining the continuous operation of the page erase operation and the page write operation of the memory device according to the first embodiment.

The continuous operation of the page erase operation and the page write operation will be described with reference to the operation waveform diagram in FIG. 2D. At a first time T1, the bit line supply signal FP rises from a ground voltage Vss to a high voltage VFP. Here, VFP is, for example, 2.0 V, and the bit line supply voltage VP is, for example, 1.0 V. Thus, N-type MOS transistors T0D to T2D operate in a linear region. In addition, the transfer signal FT rises from the ground voltage Vss to a high voltage VFT. Here, VFT is, for example, 2.0 V. As a result, the bit lines BL0 to BL2 are charged from the ground voltage Vss to a fourth voltage V4. Here, the fourth voltage V4 is equal to the bit line supply voltage VP. At the second time T2, when the bit line supply signal FP falls from VFP to the ground voltage Vss and the transfer signal FT falls from VFT to the ground voltage Vss, the bit lines BL0 to BL2 are in a floating state while maintaining the fourth voltage V4.

Figure 2E:
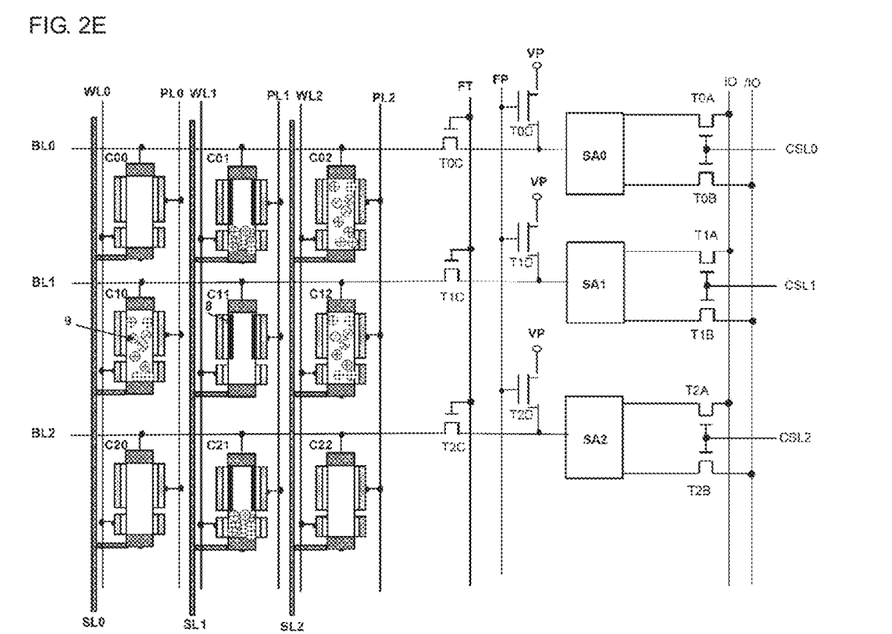
FIG. 2E is a diagram for explaining the continuous operation of the page erase operation and the page write operation of the memory device according to the first embodiment.

At a third time T3, the plate line PL1 rises from the ground voltage Vss to a first voltage V1 while the word line WL1 maintains a second voltage V2. Here, for example, the first voltage V1 and the second voltage V2 are 1.5 V and the ground voltage Vss (0 V), respectively. As a result, as illustrated in FIG. 2E, the major part of the group of positive holes 9 having positive charges gathers from the plate line PL1 side to which 1.5 V is applied to the side of the first gate conductor layer 5a connected to the word line WL1 to which 0 V is applied. Therefore, the voltage of the semiconductor base 7 surrounded by the word line WL1 rises. As a result, the PN junction between the $N^+$ layer 3a of the source line SL1 and the P-layer semiconductor base 7 is forward-biased, and the group of positive holes 9 that are extra are discharged to the $N^+$ layer 3a of the source line SL1. Since the concentration of the group of positive holes 9 gathered in the P-layer semiconductor base 7 on the word line WL1 side is sufficiently higher than the concentration of positive holes facing the $N^+$ layer 3a, the group of positive holes 9 are diffused due to the concentration gradient, and the group of positive holes 9 flow into the $N^+$ layer 3a. On the contrary, since the concentration of electrons in the $N^+$ layer 3a is higher than the concentration of electrons in the P-layer semiconductor base 7, the electrons flow into the P-layer semiconductor base 7 by diffusion due to the concentration gradient. The electrons flowing into the P-layer semiconductor base 7 recombine with the positive holes and are eliminated in the P-layer semiconductor base 7. However, all the injected electrons are not eliminated, and the electrons that are not eliminated flow into the $N^+$ layer 3b of the bit lines BL0 to BL2 due to drift in the $N^+$ layer 3b of the bit lines BL0 to BL2. Since the electrons are supplied one after another from the source line SL1, the extra positive holes are recombined with the electrons in a very short time to return to the initial state. The power consumed here is only due to the electrons flowing in from the source line SL1, and since no current flows between the $N^+$ layers 3a and 3b constantly, the power consumption is extremely small as compared with the power consumption during the page write operation. As a result, the threshold voltage of the N-channel MOS transistor region where the semiconductor base 7 is surrounded by the word line WL1 and the plate line PL1 is increased. Therefore, even if the voltage of the word line WL1 is increased, no current flows. The voltage of the semiconductor base 7 in the "0" erase state is assigned to the logical storage data "0" by the page erase operation.

Figure 2F:
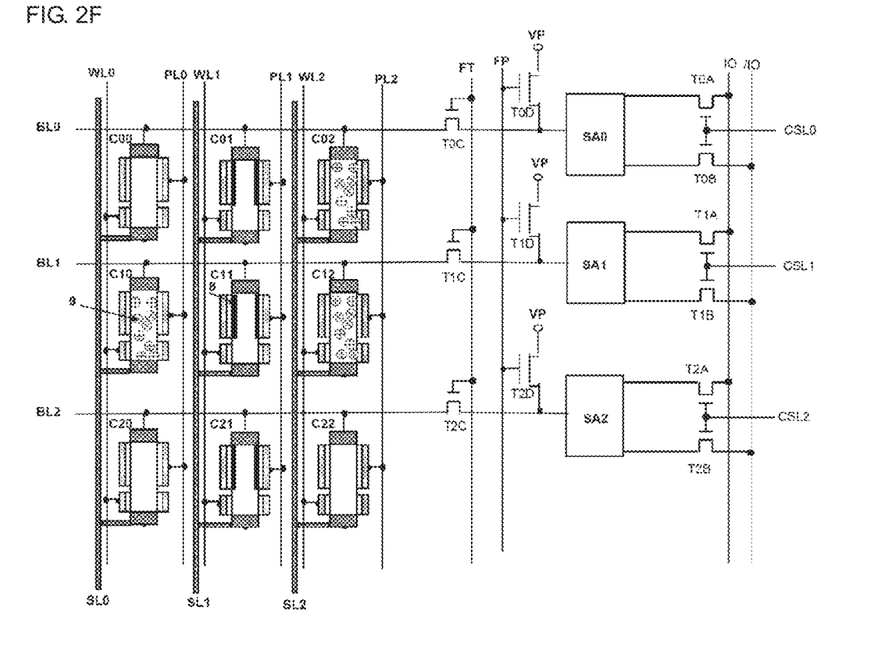
FIG. 2F is a diagram for explaining the continuous operation of the page erase operation and the page write operation of the memory device according to the first embodiment.

In this page erase operation, an inversion layer 8 is formed in the outer peripheral portion of the semiconductor base 7 surrounded by the second gate conductor layer 5b connected to the plate line PL1. The inversion layer 8 is connected to the $N^+$ layer 3b and has a large number of electrons. Thus, in the initial period of the page erase operation, some of the group of positive holes 9 in the semiconductor base 7 surrounded by the inversion layer 8 can be discharged by the positive hole-electron recombination phenomenon. Thus, the page erase operation is further accelerated. Then, at the fourth time T4, the page erase operation is finished. FIG. 2F illustrates a state in which the elimination of the group of positive holes 9 is saturated by the page erase operation.

By the fourth time T4, data for the page write operation is written to the sense amplifier circuits SA0 to SA2. The data for the page write operation is inverse logical data (an example of "inverse logical data" in the claims) of the data read to the sense amplifier circuits SA0 to SA2 in the page read operation (an example of "page read operation" in the claims). That is, in the page read operation, the memory cell in which the group of positive holes 9 are present in the semiconductor base 7 is the memory cell in which the logical data "1" is written, electricity is discharged from the bit line BL by the memory cell current, and the voltage of the bit line BL becomes a low voltage. The memory cell in which the group of positive holes 9 are not present in the semiconductor base 7 is a memory cell in which the logical data "0" is erased and the memory cell current does not flow, and the voltage of the bit line BL maintains a high voltage.

At a fifth time T5, the transfer signal FT rises from the ground voltage Vss to the high voltage VFT. As a result, by the inverse logical data for the page write operation written by the sense amplifier circuits SA0 to SA2, for example, the bit lines BL0 and BL2 fall from the fourth voltage V4 to an eighth voltage V8, and the bit line BL1 rises from the fourth voltage V4 to a ninth voltage V9. Here, the eighth voltage V8 and the ninth voltage V9 are the ground voltage Vss (0 V) and 1.2 V, respectively.

Figure 2G:
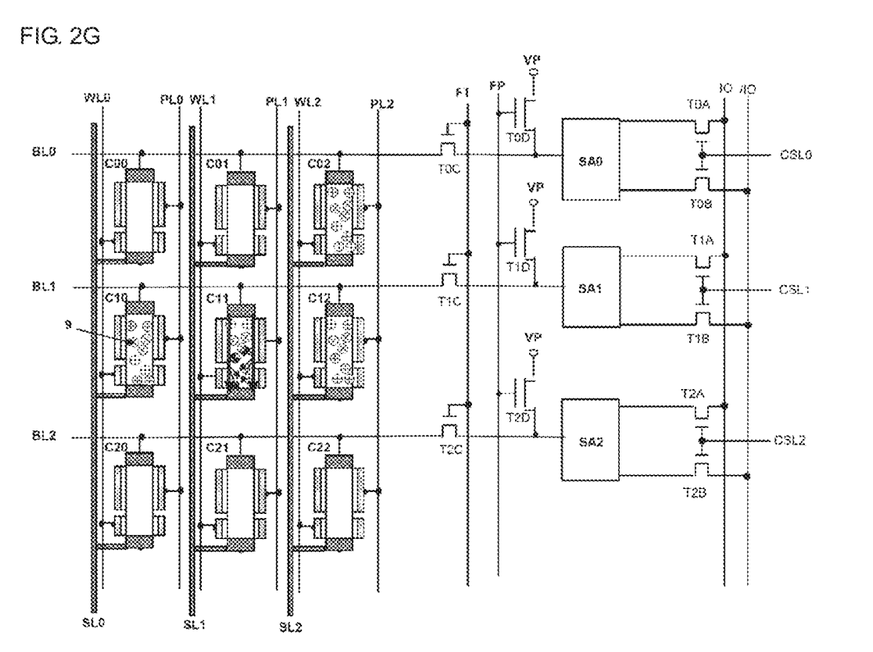
FIG. 2G is a diagram for explaining the continuous operation of the page erase operation and the page write operation of the memory device according to the first embodiment.

At a sixth time T6, the plate line PL1 and the word line WL1 rise from the first voltage V1 and the ground voltage Vss to a fifth voltage V5 and a sixth voltage V6, respectively. Here, the fifth voltage V5 may be, for example, 1.5 V, which is equal to the first voltage V1. In addition, the sixth voltage V6 is, for example, 1.5 V. At this time, since the bit lines BL0 and BL2 are at 0 V and the bit line BL1 is at 1.2 V, no memory cell current flows in the memory cells C01 and C21, and the memory cell current flows only in the memory cell C11 as illustrated in FIG. 2G. As a result, in the memory cell C11, the electric field is maximized in the boundary region of the semiconductor base between the first N-channel MOS transistor region and the second N-channel MOS transistor region, and the impact ionization phenomenon occurs in this region to generate the group of positive holes 9 to perform "1" writing on the memory cell C11.

At a seventh time T7, although the transfer signal FT falls from the high voltage VFT to the ground voltage Vss, the page write operation is continued. At an eighth time T8, the plate line PL1 and the word line WL1 fall from the fifth voltage V5 and the sixth voltage V6, respectively, to the ground voltage Vss. In addition, the bit line BL1 falls from the ninth voltage V9 to the ground voltage Vss. Thus, the page write operation is completed. Note that a reset circuit for making the bit line BL1 fall to the ground voltage Vss is not illustrated. As described above, from the first time T1 to the eighth time T8, the page erase operation is performed from T1 to T4, and the page write operation is continuously performed from T4 to T8. Therefore, the page erase operation and the page write operation are continuously performed without performing a reset operation (an example of "reset operation" in the claims) for returning the voltage applied to the plate line PL1 to the ground voltage Vss, and thus, the memory cell can be rewritten at high speed. Furthermore, the power required for selecting and resetting the plate line PL1 can be reduced.

Figure 2H:
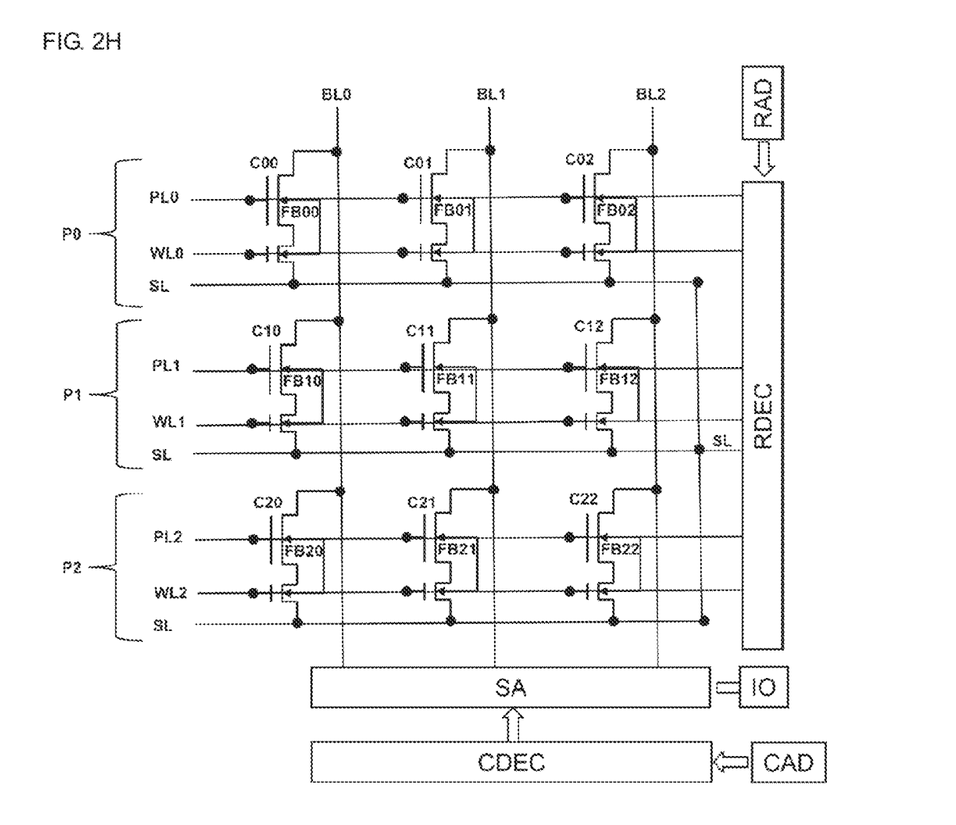
FIG. 2H is a diagram for explaining the continuous operation of the page erase operation and the page write operation of the memory device according to the first embodiment.

As illustrated in FIG. 2H, the source line SL may be connected in common to all the memory cells of adjacent pages among the pages. As a result, the degree of freedom in design and process is increased.

In FIG. 1, even if a horizontal cross-sectional shape of the Si pillar 2 is a circular shape, an elliptical shape, or a rectangular shape, the dynamic flash memory operation described in this embodiment can be performed. In addition, dynamic flash memory cells of a circular shape, an elliptical shape, and a rectangular shape may be mixed on the same chip.

In FIG. 1, a dynamic flash memory element is described by taking an example of the SGT in which the first gate insulating layer 4a and the second gate insulating layer 4b surrounding the entire side surface of the Si pillar 2 standing in the vertical direction on the substrate are provided, and the first gate conductor layer 5a and the second gate conductor layer 5b surrounding the entirety of the first gate insulating layer 4a and the second gate insulating layer 4b are provided. As described in the present embodiment, the dynamic flash memory element may have any structure as long as it satisfies the condition that the group of positive holes 9 generated by the impact ionization phenomenon are retained in the semiconductor base 7. For this purpose, the semiconductor base 7 may have a floating body structure electrically isolated from a substrate 1. Thus, the above-described dynamic flash memory operation can be performed even if the semiconductor base is formed horizontally with respect to the substrate 1 (so that the central axis of the semiconductor base is parallel to the substrate) by using, for example, the GAA (Gate All Around: see, for example, J. Y. Song, W. Y. Choi, J. H. Park, J. D. Lee, and B-G. Park: "Design Optimization of Gate-All-Around (GAA) MOSFETs," IEEE Trans. Electron Devices, Vol. 5, No. 3, pp. 186-191, (2006)) technology, which is one type of SGT, or the Nanosheet technology (see, for example, N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, (2017)). In addition, a structure in which a plurality of GAAs and Nanosheets formed horizontally are laminated may be used. In addition, a device structure using SOI (Silicon On Insulator) (for example, see J. Wan, C. Le Royer, A. Zaslavsky, and S. Critoloveanu: "A Compact Capacitor-Less High-Speed DRAM Using Field Effect-Controlled Charge Regeneration," IEEE Electron Device Letters, Vol. 33, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama: "Floating Body RAM Technology and its Scalability to 32 nm Node and Beyond," IEEE IEDM (2006), and E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003)) may be used. In this device structure, a bottom portion of the semiconductor base is in contact with an insulating layer of an SOI substrate, and another semiconductor base is surrounded by a gate insulating layer and an element isolation insulating layer. Also in this structure, the semiconductor base has the floating body structure. As described above, in the dynamic flash memory element provided by the present embodiment, the condition that the semiconductor body has the floating body structure may be satisfied. Even in a structure in which a Fin transistor (see, for example, H. Jiang, N. Xu, B. Chen, L. Zeng, Y. He, G. Du, X. Liu, and X. Zhang: "Experimental investigation of self heating effect (SHE) in multiple-fin SOI FinFETs," Semicond. Sci. Technol. 29 115021 pp. 7 (2014)) is formed on an SOI substrate, the dynamic flash memory operation can be performed as long as the semiconductor base has the floating body structure.

In FIG. 1, in the direction perpendicular to the substrate, the potential distribution of the first semiconductor base 7a and the potential distribution of the second semiconductor base 7b are connected in a portion of the semiconductor base 7 surrounded by the insulating layer 6. As a result, the semiconductor base 7 of the first semiconductor base 7a and the second semiconductor base 7b are connected in the vertical direction in the region surrounded by the insulating layer 6.

In FIG. 1, it is desirable that the vertical dimension of the first gate conductor layer 5a connected to the plate line PL be longer than the vertical dimension of the second gate conductor layer 5b connected to the word line WL to satisfy $C_{PL} > C_{WL}$. However, only by adding the plate line PL, the coupling ratio $(C_{WL}/(C_{PL}+C_{WL}+C_{BL}+C_{SL}))$ of the capacitive coupling of the word line WL to the semiconductor base 7 is reduced. As a result, a potential variation $\Delta V_{FB}$ of the semiconductor base 7 of the floating body is reduced.

In the present specification and claims, the meaning of "cover" in a case where "a gate insulating layer, a gate conductor layer, or the like covers a channel or the like" includes a case where the gate insulating layer, the gate conductor layer, or the like entirely covers the channel or the like as in an SGT or a GAA, a case where the gate insulating layer, the gate conductor layer, or the like partly covers the channel or the like as in a Fin transistor, and a case where the gate insulating layer, the gate conductor layer, or the like overlaps with the channel or the like as in a planar transistor.

In FIG. 1, the first gate conductor layer 5a may be divided into two or more isolated gate conductor layers in plan view or in the vertical direction, and the respective isolated gate conductor layers may be operated as conductor electrodes of the plate line synchronously or asynchronously with the same driving voltage or different driving voltages. Similarly, the second gate conductor layer 5b may be divided into two or more isolated gate conductor layers in plan view or in the vertical direction, and the respective isolated gate conductor layers may be operated as conductor electrodes of the word line synchronously or asynchronously with the same driving voltage or different driving voltages. Also in the above manner, the dynamic flash memory operation is performed. If the first gate conductor layer 5a is divided into two or more isolated gate conductor layers, at least one of the isolated gate conductor layers serves as the first gate conductor layer 5a. Also, if the second gate conductor layer 5b is divided into two or more isolated gate conductor layers, at least one of the isolated gate conductor layers serves as the second gate conductor layer 5b. In addition, in the vertical direction, the isolated gate conductor layers of one of the first gate conductor layer 5a and the second gate conductor layer 5b may be arranged on both sides of the other of the first gate conductor layer 5a and the second gate conductor layer 5b.

In addition, the above conditions of the voltages applied to the bit line BL, the source line SL, the word line WL, and the plate line PL and the voltage of the floating body are examples for performing basic operations of the erase operation, the write operation, and the read operation. Other voltage conditions may be used as long as the basic operations of the present invention can be performed.

In addition, a junctionless structure may be used in which the $N^+$ layers 3a and 3b of the dynamic flash memory cell illustrated in FIG. 1 have the same conductivity as that of the semiconductor base 7, which is a P layer. This also applies to the other embodiments.

Features

The present embodiment has the following features.

The features are in the continuous operation of the page erase operation and the page write operation in the dynamic flash memory cell according to the first embodiment of the present invention. That is, the page erase operation and the page write operation are continuously performed without performing the reset operation for returning the voltage applied to the plate line PL to the ground voltage Vss, and thus, the memory cell can be rewritten at high speed. Furthermore, the power required for selecting and resetting the plate line PL can be reduced. As a result, a high-speed page rewrite operation of storage data in the memory cell can be performed, and higher speed and lower power consumption can be achieved as compared with the dynamic flash memory cell of the related art.

Other Embodiments

Although the Si pillar is formed in the present invention, a semiconductor pillar made of a semiconductor material other than Si may be used. This also applies to the other embodiments according to the present invention.

In addition, in "1" writing, pairs of electrons and positive holes may be generated by using a gate induced drain leakage (GIDL) current described in E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003), and the floating body may be filled with the generated group of positive holes. This also applies to the other embodiments according to the present invention.

In FIG. 1, the dynamic flash memory operation is performed even in a structure in which the polarities of the conductivity types of the N$^+$ layers 3a and 3b and the P-layer Si pillar 2 are reversed. In this case, the majority carriers are electrons in the Si pillar 2 which is N-type. Therefore, a group of electrons generated by the impact ionization are accumulated in the semiconductor base 7, and the "1" state is set.

In addition, the memory block may be formed by arranging the Si pillars of the memory cells two dimensionally in a square lattice pattern or an oblique lattice pattern. In a case where the Si pillars are arranged in an oblique lattice pattern, the Si pillars connected to one word line may be arranged in a zigzag pattern or a sawtooth pattern with a plurality of Si pillars as one side. This also applies to the other embodiments.

In addition, various embodiments and modifications can be made to the present invention without departing from the broad spirit and scope of the present invention. Furthermore, each of the above-described embodiments is intended to describe an example of the present invention, and does not limit the scope of the present invention. The above-described embodiments and modifications can be freely combined. Furthermore, even if some of the constituent features of the above-described embodiments are removed as necessary, it is within the scope of the technical idea of the present invention.

With the memory device using a semiconductor element according to an embodiment of the present invention, a dynamic flash memory which is a memory device using a high-density and high-performance SGT can be obtained.

What is claimed is:

1. A memory device using a semiconductor element in which, in plan view, a plurality of pages are arranged in a column direction on a substrate, each of the plurality of pages including a plurality of memory cells arranged in a row direction, wherein each of the memory cells included in each of the pages comprises:
a semiconductor base standing vertically or extending horizontally on the substrate;
a first impurity region and a second impurity region at both ends of the semiconductor base;
a gate insulating layer in contact with a side surface of the semiconductor base between the first impurity region and the second impurity region;
a first gate conductor layer covering a part or an entirety of the gate insulating layer; and
a second gate conductor layer adjacent to the first gate conductor layer and in contact with a side surface of the gate insulating layer,
in each of the memory cells, the first impurity region is connected to a source line, the second impurity region is connected to a bit line, one of the first gate conductor layer and the second gate conductor layer is connected to a word line, and the other of the first gate conductor layer and the second gate conductor layer is connected to a plate line,
in a page erase operation, a first voltage higher than a ground voltage is applied to a plate line of the page, a second voltage equal to or higher than the ground voltage is applied to the word line, a third voltage equal to the ground voltage is applied to the source line, and a fourth voltage higher than the ground voltage is applied to all the bit lines,
in a page write operation, a fifth voltage higher than the ground voltage is applied to the plate line, a sixth voltage higher than the ground voltage is applied to the word line, a seventh voltage equal to the ground voltage is applied to the source line, an eighth voltage equal to the ground voltage is applied to the bit line of any memory cell among the memory cells to maintain an erase state, and a ninth voltage higher than the ground voltage is applied to the bit line of any memory cell among the memory cells to be in a write state, and
the page erase operation and the page write operation are continuously performed without performing a reset operation for returning the voltage applied to the plate line to the ground voltage.

2. The memory device using the semiconductor element according to claim 1, wherein the ground voltage is zero volts.

3. The memory device using the semiconductor element according to claim 1, wherein
in the page erase operation, some of a group of positive holes in the semiconductor base of each of the memory cells of the page are eliminated to reduce a number of positive holes, and
in the page write operation, the number of positive holes in the semiconductor base of a selected memory cell among the memory cells of the page is increased by an impact ionization phenomenon.

4. The memory device using the semiconductor element according to claim 1, wherein
the word line and the plate line are arranged in parallel in plan view, and
the bit line is arranged in a direction perpendicular to the word line and the plate line in plan view.

5. The memory device using the semiconductor element according to claim 1, wherein a first gate capacitance between the semiconductor base and the other of the first gate conductor layer and the second gate conductor layer, to which the plate line is connected, is larger than a second gate capacitance between the semiconductor base and the one of the first gate conductor layer and the second gate conductor layer, to which the word line is connected.

6. The memory device using the semiconductor element according to claim 1, wherein the source line is isolated for each of the memory cells arranged in the row direction and is arranged in parallel with the word line and the plate line in plan view.

7. The memory device using the semiconductor element according to claim 1, wherein the source line is connected in common to all the memory cells of adjacent pages among the pages in plan view.

8. The memory device using the semiconductor element according to claim 1, wherein the semiconductor base is a P-type semiconductor layer, and the first impurity region and the second impurity region are N-type semiconductor layers.

9. The memory device using the semiconductor element according to claim 1, wherein data in the memory cells connected to at least two pages among the pages is selectively erased in the page erase operation.

10. The memory device using the semiconductor element according to claim 1, wherein the word line and the plate line are connected to a row decoder circuit, a row address is to be input to the row decoder circuit, and any page among the pages is to be selected in accordance with the row address.

11. The memory device using the semiconductor element according to claim 1, wherein the bit line is connected to a sense amplifier circuit with a switch circuit interposed therebetween, the sense amplifier circuit is connected to a column decoder circuit, a column address is to be input to the column decoder circuit, and the sense amplifier circuit is to be selectively connected to an input/output circuit in accordance with the column address.

12. The memory device using the semiconductor element according to claim 11, wherein in the page write operation, inverse logical data of data in the page write operation is written in the sense amplifier circuit.

13. The memory device using the semiconductor element according to claim 1, wherein the first voltage and the fifth voltage are equal.

14. The memory device using the semiconductor element according to claim 1, wherein one or both of the first gate conductor layer and the second gate conductor layer are divided into two or more isolated gate conductor layers in plan view or in a vertical direction, and the isolated gate conductor layers are to be operated synchronously or asynchronously.

15. The memory device using the semiconductor element according to claim 14, wherein in plan view or in the vertical direction, the isolated gate conductor layers of one of the first gate conductor layer and the second gate conductor layer are arranged on both sides of the other of the first gate conductor layer and the second gate conductor layer.

* * * * *